(12) United States Patent
Arora et al.

(10) Patent No.: US 12,225,672 B2
(45) Date of Patent: Feb. 11, 2025

(54) ALERT SYSTEM, DEGASSING UNIT FOR AN ELECTRONIC HOUSING, AND ELECTRONIC HOUSING COMPRISING DEGASSING UNIT

(71) Applicant: MANN+HUMMEL Ventures Pte. Ltd., Singapore (SG)

(72) Inventors: Shikhar Arora, Morrisville, NC (US); Joseph Dyer, Portage, MI (US); Michael Harenbrock, Ludwigsburg (DE); Ales Novotny, Benetice (CZ); Jurgen Kosicki, Erligheim (DE)

(73) Assignee: MANN+HUMMEL Ventures Pte. Ltd., Singapore (SG)

( * ) Notice: Subject to any disclaimer, the term of this patent is extended or adjusted under 35 U.S.C. 154(b) by 147 days.

(21) Appl. No.: 18/162,726

(22) Filed: Feb. 1, 2023

(65) Prior Publication Data
US 2024/0260210 A1    Aug. 1, 2024

(51) Int. Cl.
*H05K 5/02*    (2006.01)
(52) U.S. Cl.
CPC ......... *H05K 5/0214* (2022.08); *H05K 5/0208* (2013.01)
(58) Field of Classification Search
CPC .................... H05K 5/0214; H05K 5/0208
USPC ........................................................ 361/807
See application file for complete search history.

(56) References Cited

U.S. PATENT DOCUMENTS

| | | | |
|---|---|---|---|
| 2019/0348722 A1 | 11/2019 | Hernley et al. | |
| 2021/0320376 A1 | 10/2021 | Zbiral et al. | |
| 2021/0376422 A1* | 12/2021 | Kosicki | H01M 50/394 |
| 2022/0029216 A1* | 1/2022 | Kim | H01M 10/613 |
| 2022/0085428 A1 | 3/2022 | Engle et al. | |
| 2022/0393258 A1 | 12/2022 | Fahad et al. | |

(Continued)

FOREIGN PATENT DOCUMENTS

| | | |
|---|---|---|
| CN | 106594339 A | 4/2017 |
| CN | 109065974 A | 12/2018 |
| CN | 208507799 U | 2/2019 |

(Continued)

OTHER PUBLICATIONS

EPO Search Report in corresponding EPO Appln. No. 24153339.7, Sep. 16, 2024, Munich, Germany.

*Primary Examiner* — Binh B Tran (57) ABSTRACT

An alert system for an electronic housing, including: a gas property sensor, wherein a processor is configured to receive gas property data from the gas property sensor, and configured to determine a property of a battery included in the electronic housing; a degassing unit for attaching to the electronic housing and configured to enable passage of gases and to prevent passage of liquids and solids, the gas property sensor being attached to the degassing unit at an inner side. A degassing unit comprising a base comprising an attachment means for fluid-tightly attaching to a venting opening of the electronic housing and an opening covered by a semipermeable membrane thereby forming a gas passage; a sensor module including a gas property sensor, the sensor module attachable to the base on an inner side of the base, the sensor module extending away from the semipermeable membrane towards a direction substantially perpendicular to the semipermeable membrane.

20 Claims, 5 Drawing Sheets

(56) References Cited

U.S. PATENT DOCUMENTS

2023/0138465 A1   5/2023  Lim et al.
2024/0288501 A1   8/2024  Crymble et al.

FOREIGN PATENT DOCUMENTS

| CN | 114695992 A    | 7/2022 |
| DE | 102021200672 A1 | 7/2022 |
| EP | 4002571 A1     | 5/2022 |

* cited by examiner

ALERT SYSTEM, DEGASSING UNIT FOR AN ELECTRONIC HOUSING, AND ELECTRONIC HOUSING COMPRISING DEGASSING UNIT

TECHNICAL FIELD

An aspect of the disclosure relates to an alert system for an electronic housing. Another aspect of the disclosure relates to a degassing unit for an electronic housing. Another aspect of the disclosure relates to an electronic housing.

BACKGROUND ART

US2021376422 AA disclosed a degassing unit for an electronic housing having a base body with a gas passage opening and fluid-tightly connected to a rim of a pressure compensation opening of the electronics housing.

SUMMARY

An aspect of the disclosure relates to an alert system for an electronic housing. The alert system may include a gas property sensor and a processor. The gas property sensor and the processor may be communication couplable to each other via a communication channel, e.g., they may be communication coupled to each other, such as via wires which may also include power supply. The processor may be configured to receive gas property data from the gas property sensor, and further configured to, based on the gas property data, determine a property of a battery included in the electronic housing. The alert system may further include a degassing unit for attaching to the electronic housing and configured to enable passage of gases and to prevent passage of liquids and solids. The gas property sensor may be attached to the degassing unit at an inner side which may be a side for facing an interior of the electronic housing.

According to various embodiments the processor may be included by a battery management system (BMS), for example may be a processor of a BMS, the BMS may be internal or external to the electronic housing, which may be a battery housing.

According to some embodiments, the communication channel may be a wireless communication, a wired communication channel, or a combination thereof.

According to some embodiments, the communication channel may include a first wired communication channel and a second wireless communication channel.

According to various embodiments one of the first and second wireless communication channels may be a main channel and the other one may be a backup channel. The processor may be configured to received data via the main channel and, when the main channel is determined to be faulty, receive data via the backup channel.

According to various embodiments the processor may be configured to determine whether the communication channel is faulty, and issue an alert when determined that said communication channel is faulty.

According to various embodiments the property of the battery may be a probability of a future thermal runaway within a pre-determined period of time.

As used herein and in accordance with various embodiments, a gas property sensor may be configured to sense one or more properties of the gas. A property of the gas may be, for example, a concentration of a gas component, a temperature, a pressure. According to various embodiments, the gas property may be one or more selected from: $CO_2$, $H_2$, temperature, pressure. Accordingly, the gas property sensor may include one or more transducers, and may further include respective driving circuitry, e.g., on a same sensor printed circuit board, and/or a same housing. In some embodiments, the probability of a future thermal runaway could be determined based on a gas property, for example comparing gas property (e.g. a $CO_2$ concentration) measured by the sensor to a reference. For example, the reference may be a baseline, an outdoor environment value, a stored value, or a pre-determined value. If a gas property is out of a normal condition or range, e.g., a $CO_2$ concentration measured by the sensor is higher than the reference, or higher than the reference multiplied by a multiplicator greater than 1, then the probability is high (e.g., 1, instead of low 0). In another example the change of a gas property may be measured, for example, an onset rate of a $CO_2$ concentration and compared to a pre-determined threshold. In some embodiments, an alarm may be set (from a re-set state) once the gas property is out of a normal condition or range and the rate of change is above a pre-determined rate. The alert system may be configured according to one of the herein explained embodiments and/or examples.

An aspect of the disclosure relates to a degassing unit for an electronic housing. The degassing unit may include a base including an attachment means for fluid-tightly attaching the base to a venting opening of the electronic housing and an opening covered by a semipermeable membrane thereby forming a gas passage. The side of the base facing the venting opening is an inner side (facing an inner volume of the electronic housing) and the opposite side is an outer side facing the environment when in attached configuration, meaning when the degassing unit is attached to the electronic housing. Thereby an inner volume of the electronic housing is separated from the exterior by the semipermeable membrane.

According to various embodiments, the semipermeable membrane enables passage of gases and prevents passage of liquids and solids therethrough. The semipermeable membrane may be substantially flat, when there is substantially no gas pressure difference between opposing sides of the membrane. In one example, substantially flat may mean that the membrane is arranged and/or attached at the base so that it is held in a substantially flat position when there is substantially no gas pressure difference between opposing sides of the membrane. The semipermeable membrane may distend if there is enough pressure difference between both sides. In examples, the semipermeable membrane may be attached to the base by ultrasonic welding, thus the semipermeable membrane may be (or have been) ultrasonically welded to the base.

According to various embodiments, the degassing unit may include a sensor module including a gas property sensor. The sensor module may be attachable to the base, preferably on an inner side of the base.

According to some embodiments, the sensor module may include a sensor housing.

According to various embodiments, the sensor module may be configured to, when attached to the base, protrude from the base, for example, extend from a plane defined by the semipermeable membrane, towards a first direction. The first direction may be substantially perpendicular to the semipermeable membrane.

According to various embodiments, the base may include a cavity adapted to cooperably engage with the sensor module.

According to various embodiments the sensor module may be configured to conformally fit into the cavity. The sensor module and the cavity may be configured to provide a tight fit. For example, a sensor housing may conformally fit to the cavity.

According to various embodiments the cavity opening may be on the inner side, in other words, in and/or facing an inner volume of the electronic housing.

According to various embodiments, the degassing unit may further include a connector on a side of the housing which is outside the cavity, e.g., on top side facing away from the cavity's opening for connection with an electronic housing's inner processor, such as an inner BMS.

According to various embodiments, the connector may include a sleeve which fits over the external portion of the sensor module and extends (optionally conformally extends) on at least on 2 opposite sides of the sensor module (e.g., a sensor housing), further optionally to a length all the way to the base.

According to various embodiments, the cavity (convex side) may extend from the base towards the outer side.

According to some embodiments, electrical connections pass through a wall of the cavity, e.g. at the end of the cavity, to the other side, in more details from the inner side to the outer side. The electrical connections may be through connections which may be fluid-tightly passing the wall. In such embodiments, connectors may be blocked from gases from the battery by the sensor module thereby not becoming brittle by exposure to gases which may be emitted by the battery cells.

According to various embodiments, the cavity and the sensor module may be configured such that the sensor module protrudes out of the base, e.g., out of a main plane of the base, towards the inner volume.

According to various embodiments, a protruding portion of the sensor module may be equal or less than a portion receivable by in the cavity. The protruding portion may have a length, e.g., a maximum length of the sensor module that extends out of the base, or is orthogonal to a plane of the base through which the sensor module protrudes.

According to various embodiments the sensor module may include openings for allowing gas exchange for sensing, so that gas can reach the sensor. The openings may be arranged at a portion of the sensor module that is unobstructed, e.g., unobstructed by the cavity walls or fasteners. The openings may face towards a central axis of the degassing unit.

According to some embodiments, the sensor module overlaps the semipermeable membrane and covers less than half, preferably between 1/100th and one tenth, of a gas passage area of the gas passage. This allows for a maximization of the membrane area.

According to various embodiments, the sensor module may further include a locking mechanism for restricting movement of the sensor module in an insertion direction. The insertion direction is a direction in which the sensor module is insertable into the cavity. For example, the locking mechanism may be in part provide by a PCB, and/or an elastic element attached to the PCB. In another example, the locking mechanism may be in part provide by a sensor housing.

According to various embodiments, the locking mechanism may be at least one snap lock element for interlocking with the module, e.g., with a PCB or a housing.

According to various embodiments, the at least one snap lock element may include a beam and a hook. The PCB or the housing may include an edge that cooperates with the hook when the sensor module is engaged in the cavity.

According to various embodiments, the at least one snap lock element may be a metal part soldered on a same printed circuit board as the sensor.

According to various embodiments, the sensor module may include a recess for receiving the beam. For example, the recess may be a recess of a PCB or a recess of a sensor housing.

According to various embodiments, a main frame of the base, a wall defining the bottom of the cavity surrounded by at least 3 side walls, and optionally four walls, of the cavity.

According to various embodiments, a main frame of the base, a wall defining the bottom of the cavity surrounded by at least 3 side walls, and optionally four walls, of the cavity, and the snap lock element may be a monolithic injection molded part.

According to various embodiments, the degassing unit may include a grid. The grid may serve the function of protecting the membrane, for example during assembly. Further the grid may also serve as a spark arrestor. The grid may include an angled (e.g., bent) portion which extends into the inner volume. The angled portion may include attachment means adapted to cooperably engage with the sensor module, for example, holes may be provided, e.g., for screws.

An aspect of the disclosure relates to an electronic housing including the battery system, a battery management system, and the degassing, e.g., of any of the above embodiments, wherein the gas property sensor is communication couplable or coupled to the battery management system.

According to various embodiments, the electronic housing may be a main battery of an electrical or hybrid vehicle.

DETAILED DESCRIPTION

Figure 1:
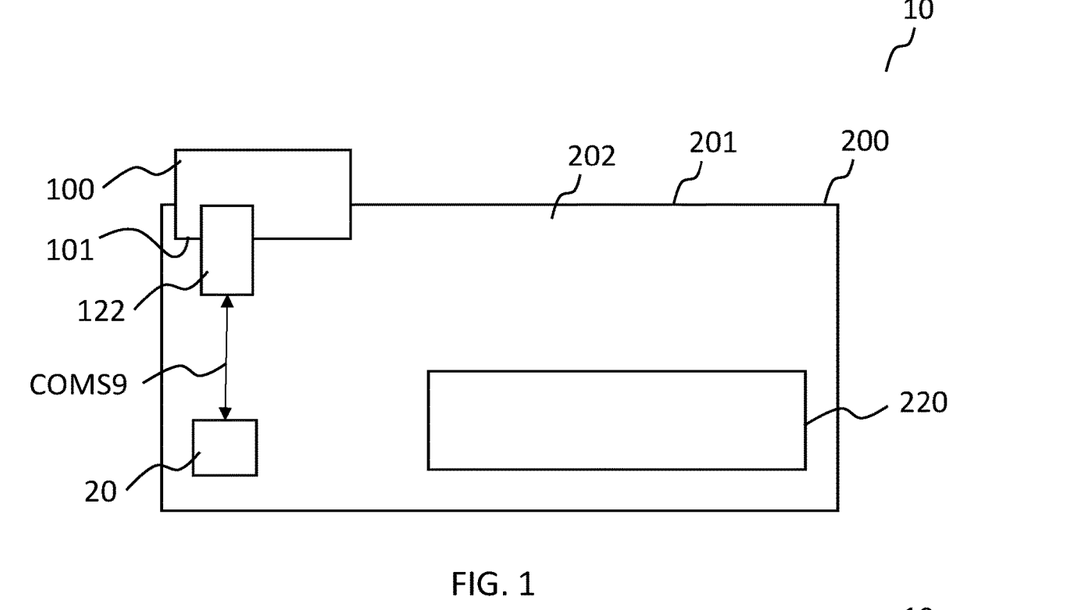
FIG. 1 shows an alert system 10 for an electronic housing 200 in accordance with various embodiments.

FIG. 1 shows an alert system 10 for an electronic housing 200 in accordance with various embodiments. The housing 200 is defined by a housing wall 201 that surrounds an inner volume 202 from an outer environment (also simply referred as environment). The alert system 10 includes a gas property sensor 122 and a processor 20. The gas property sensor 122 and the processor 20 may be communication couplable to each other via a communication channel COMS9. The processor 20 may be configured to receive gas property data GP1 from the gas property sensor 122, and further configured to, based on the gas property data GP1, determine a property of a battery 220 included in the electronic housing 200. The alert system 10 may include a degassing unit 100 for attaching to the electronic housing 200. The degassing unit 100 may be configured to enable passage of gases and to prevent passage of liquids and solids, between the inner volume 202 and the environment. The gas property sensor 122 may be attached to the degassing unit 100 at an inner side 101 which may be a side for facing an interior of the electronic housing 200.

As used herein and in accordance with various embodiments, the gas property data may be a $CO_2$ concentration, a $H_2$ concentration, a temperature of the gas, a pressure of the gas, or a combination thereof. The gas property sensor may be configured accordingly, for example, including one or more of: a $CO_2$ concentration sensor, a $H_2$ concentration sensor, a temperature sensor, a pressure sensor. The sensors may be electronic components (such as integrated circuits) and may be further soldered on a same gas property sensor unit.

Figure 2:
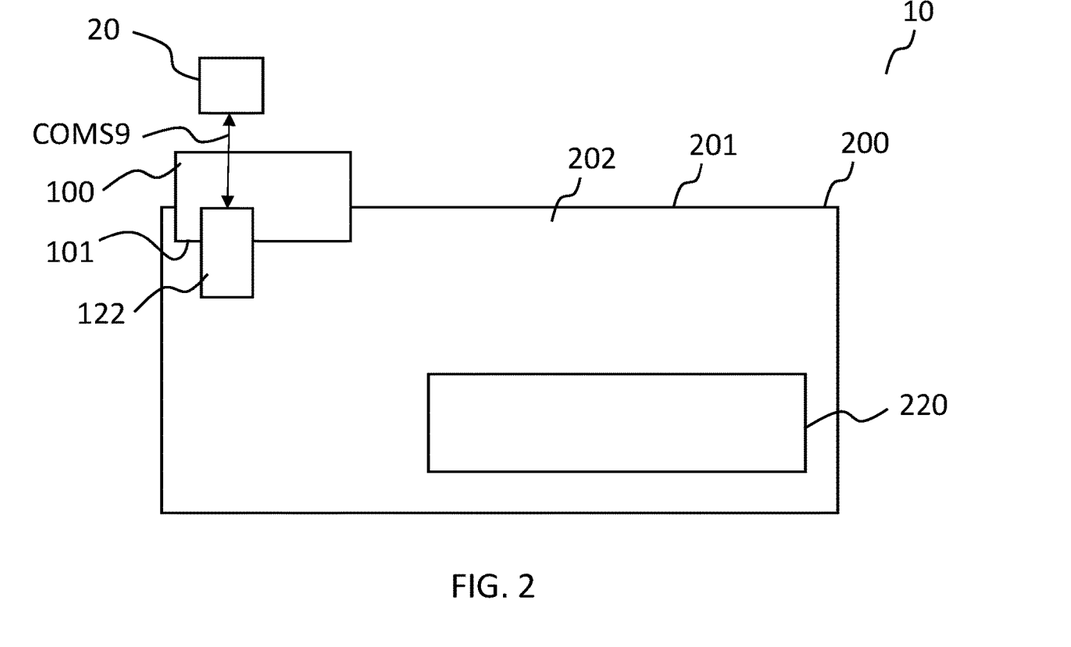
FIG. 2 shows another embodiment of an alert system 10 wherein the processor 20 is outside the inner volume 202 of the electronic housing 200.

In some embodiments, as shown in FIG. 1 by way of example, the processor 20 may be included within the inner volume 202 of the electronic housing 200. In other embodiments, as shown by FIG. 2 by way of example, the processor 20 may be outside the inner volume 202 of the electronic housing 200. For ease of description, other embodiments may be described on the basis of a processor 20 included within the inner volume 202, however a processor 20 outside the inner volume 202 of the electronic housing 200 is also contemplated as alternative.

According to some embodiments the processor 20 may be included by a battery management system BMS1. The communication channel COMS9 may include a first wired communication channel COMS9.1 and a second wireless communication channel COMS9.2. Such is schematically exemplified in FIG. 3.

Figure 3:
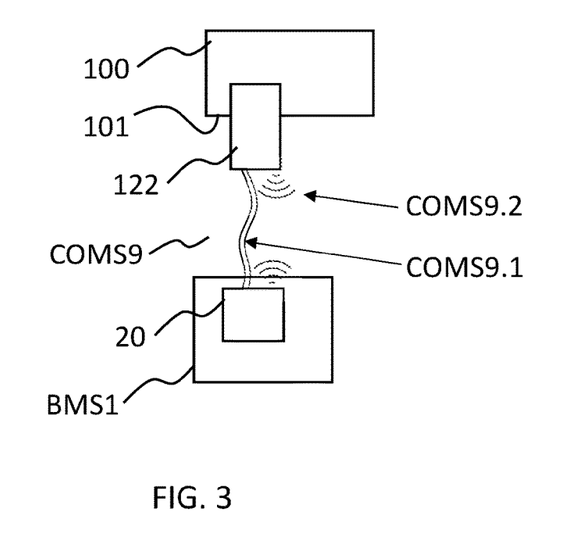
FIG. 3 shows schematically a first and a second communication channels.

According to various embodiments one of the first COMS9.1 and second COMS9.2 wireless communication channels may be a main channel and the other one may be a backup channel. The processor 20 may be configured to received data via the main channel and, when the main channel may be faulty, receive data via the backup channel.

According to various embodiments the processor 20 may be configured to determine whether the communication channel COMS9 is faulty, and issue an alert when determined that said communication channel is faulty. In one example, the communication channel is faulty when at least one of the first COMS9.1 and second COMS9.2 wireless communication channels is faulty.

According to various embodiments, the property of the battery 220 determined by the processor 20 based on the gas property data GP1 may be a probability of a future thermal runaway within a pre-determined period of time RAR1. In some embodiments, the probability of a future thermal runaway could be determined based on a gas property, for example comparing a $CO_2$ concentration measured by the sensor to a reference. For example, the reference may be a baseline, an outdoor environment value, a stored value, or a pre-determined value. If a gas property is out of a normal condition, e.g., a $CO_2$ concentration measured by the sensor is higher than the reference, or higher than the reference multiplied by a multiplicator greater than 1, then the probability is high (e.g., 1, instead of low 0). In another example the change of a gas property may be measured, for example, an onset rate of a $CO_2$ concentration and compared to a pre-determined threshold. The alert system may be configured according to one of the herein explained embodiments and/or examples.

According to some embodiments, an alarm may be set from a re-set state once a $CO_2$ concentration is higher than a pre-determined value (e.g., 450 ppm) and a rate of increase of $CO_2$ concentration is higher than a pre-determined rate (e.g., 10 ppm/second). The alert system may be configured accordingly.

Figure 4:
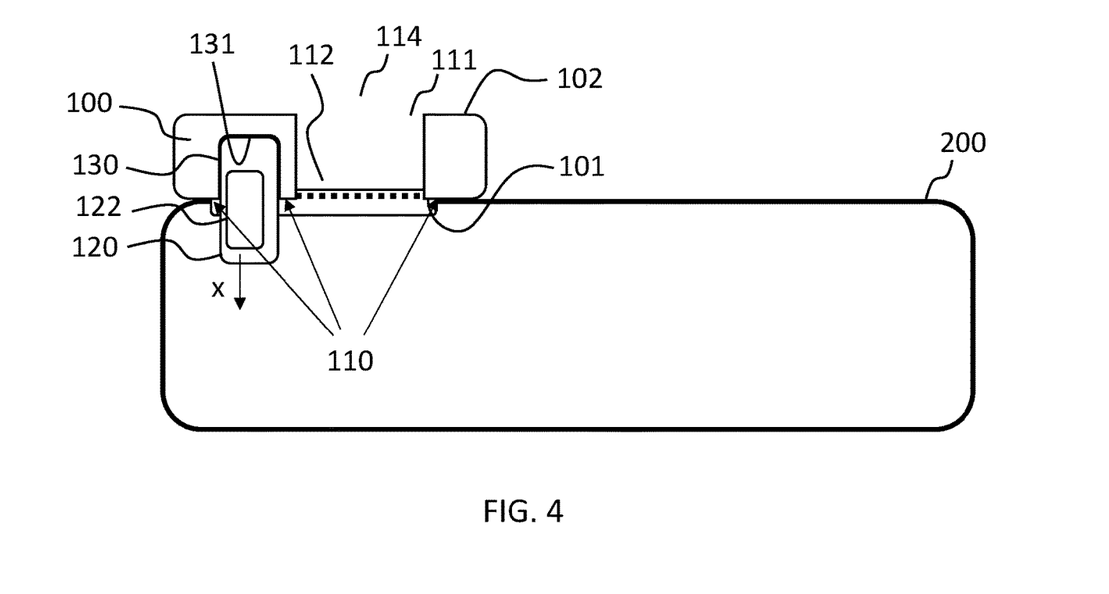
FIG. 4 shows a cross sectional view of an alert system 10 and details to degassing unit 100 and sensor module 120.

Various embodiments relate to a degassing unit 100 for an electronic housing 200. FIG. 4 shows an exemplary degassing unit 100 in relation to an electronic housing 200, schematically depicted as a cross section for ease of explanation. The degassing unit 100 includes a base 110. The base includes (not shown) an attachment means for fluid-tightly attaching the base 110 to a venting opening of the electronic housing 200, examples of attachment means are screws, screw holes, and sealing rings. The base may include an opening 111 covered by a semipermeable membrane 112 thereby forming a gas passage 114, the side of the base 110 facing the venting opening being an inner side 101 and the opposite side being an outer side 102 facing the environment when in attached configuration. The semipermeable membrane 112 enables passage of gases and prevents passage of liquids and solids therethrough. In examples, the semipermeable membrane may be attached to the base by ultrasonic welding. The semipermeable membrane 112 may be substantially flat, when there is no gas pressure difference between opposing sides of the membrane, as shown in FIG. 4.

The degassing unit 100 may be configured to receive a sensor module 120 including a gas property sensor 122, the sensor module 120 attachable to the base 110 on an inner side 101 of the base 110. The sensor module 120 may be installed in the degassing unit 100 (e.g., to the base 110 on an inner side 101 of the base 110), and thus the degassing unit may include the sensor module 120.

Figure 5:
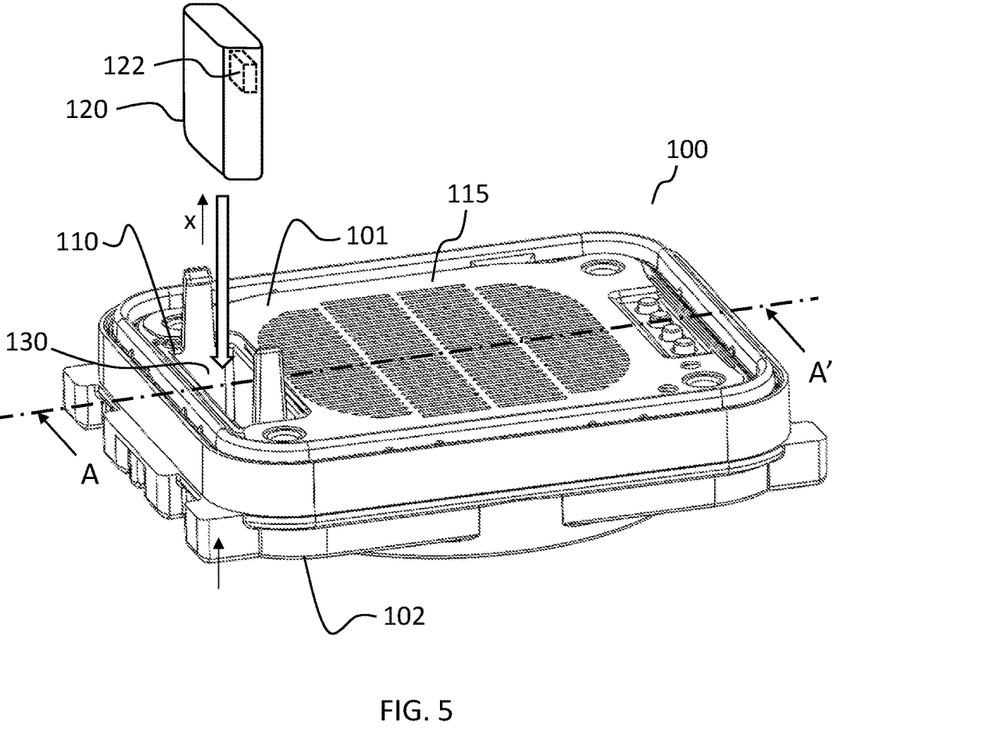
FIG. 5 and FIG. 6 (cut view A-A') show an example of a degassing unit 100 in accordance with various embodiments.
Figure 6:
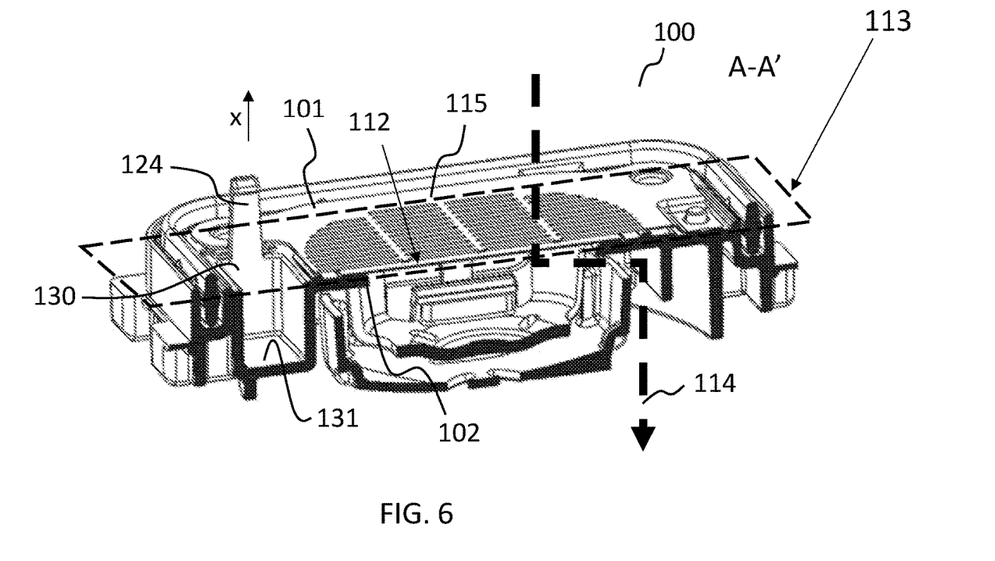

FIG. 5 and FIG. 6 show an example of a degassing unit 100 in accordance with various embodiments, for illustration purposes of features that may also be implemented in other embodiments. FIG. 6 is a cut view A-A' of the degassing unit 100 of FIG. 5. The degassing unit 100 is configured to receive a sensor module 120 including a gas property sensor 122. The sensor module 120 is attachable to the base 110 on an inner side 101 of the base 110, for example insertable (or inserted) in the cavity 130. When installed in the base 110, the sensor module 120 allows gas exchange between gas property sensor 122 and an interior of an electronic housing on which the degassing unit 100 is installed. FIG. 5 shows the base plane 113, which may be parallel to the semipermeable membrane 112. In the example, a grid 115 covers the semipermeable membrane 112, the grid 115 may be flat and may be arranged parallel to the semipermeable membrane 112. In other embodiments, the grid 115 may have other, non-flat, shapes.

In some embodiments, the sensor module 120 may be configured to, when attached to the base 110, extend towards an inner volume 202 of the electronic housing, e.g., extend from a plane 113 defined by the semipermeable membrane (parallel to the base plane 113) in a first direction X and out of the plane. The direction X is substantially perpendicular to the semipermeable membrane 112, when said membrane is in resting position, i.e., not distended due to pressure difference between both sides.

According to various embodiments, the base 110 may include a cavity 130 adapted to cooperably engage with the sensor module 120.

According to various embodiments, the sensor module 120 may be configured to conformally fit into the cavity 130, for example, having essentially no space left between the walls so that thereby the sensor module 120 cannot move in relation to the base 110. According to various embodiments the sensor module 120 may further include a locking mechanism 132 for restricting movement of the sensor module 120 in the first direction X.

According to various embodiments, the cavity 130 opening may be on the inner side 101.

The sensor module 120 is depicted as a block or sensor housing comprising the gas property sensor 122, this illustration is used for easy of explanation, however variants are also possible in accordance with various embodiments, for example, the sensor module may be a PCB comprising the gas property sensor 122. In certain embodiments, the PCB may be coated, for example, conformally coated.

Figure 7:
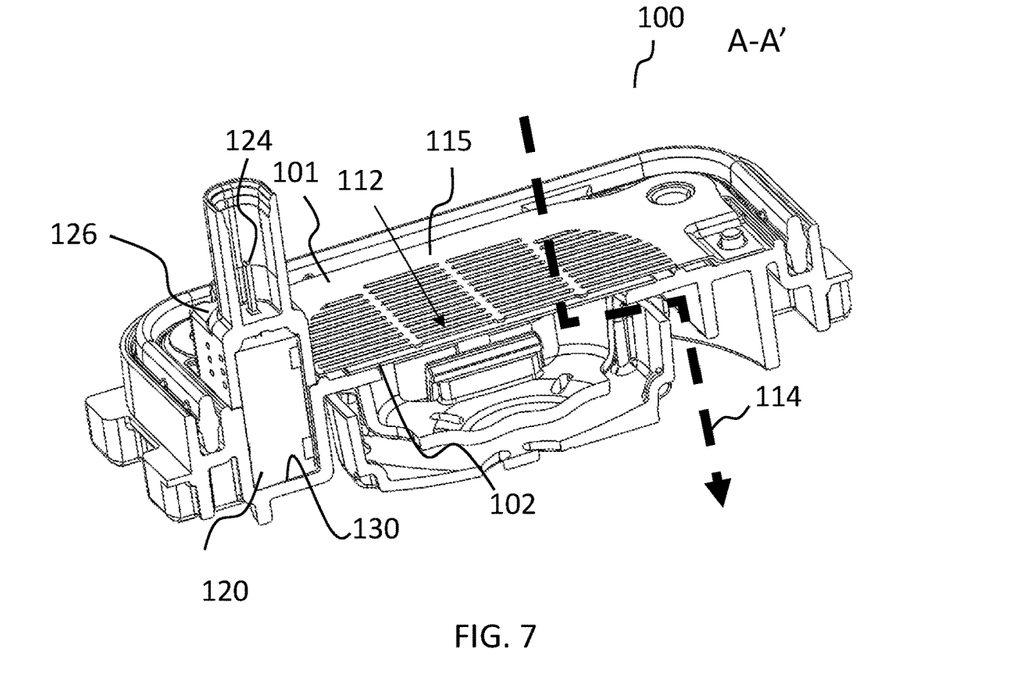
FIG. 7 shows a cut view A-A' of the degassing unit 100 of FIG. 5 with the sensor module 120 inserted into the cavity 130.

FIG. 7 shows a cut view A-A' of the degassing unit 100 of FIG. 5 wherein the sensor module 120 is fit into the cavity 130. In this example, the sensor module 120 includes a sensor housing, however the disclosure is not limited thereto. In some embodiments, and as illustrated in FIG. 7 by way of example, the degassing unit 100 may include a connector 124 on a side of the sensor module 120 which is outside the cavity. In the example, the sensor module includes the connector 124, e.g., top side facing away from the cavity 130, for connection with an electronic housing's 200 inner BMS1. The electrical connector 124 may be an electrical connector configured to allow to a power and/or signal connection between the gas property sensor 122 and another circuit such as a BMS1. Thus, the connector 124 would usually have at least 2 separate conductors, e.g., 2 pins, or 3 pins if power, ground, and signal are separated. More pins may also be envisaged, e.g., for an alert connection.

According to some embodiments the cavity 130 closed side (as oppose to cavity opening) extends towards the outer side 102. In other words, the cavity opening is on the inner side.

According to various embodiments, the connector 124 may include a sleeve 126 which fits over the external portion of the sensor module 120 and extends on at least on 2 opposite sides of the sensor module 120, in this case conformally fitting with the sensor housing. The sleeve 126 may conformally extend on at least on 2 opposite sides of the sensor module 120. The sleeve 126 may extend on all sides of the sensor module 120. The extension of the sleeve 126 may be to a length all the way to contact with the base 110, e.g., at the border of the cavity 130. Thereby electrical contacts and/or conductive traces are covered, and do not becoming brittle by exposure to gases.

According to various embodiments the cavity 130 and the sensor module 120 may be configured such that the sensor module 120 protrudes out towards the inner volume 202. In some embodiments, the protrusion may be away from a base plane 113 of the base 110. According to various embodiments, a protruding portion of the sensor module 120 may have a dimension equal or less than of a portion receivable by in the cavity 130. In one example the dimension is length.

Figure 8:
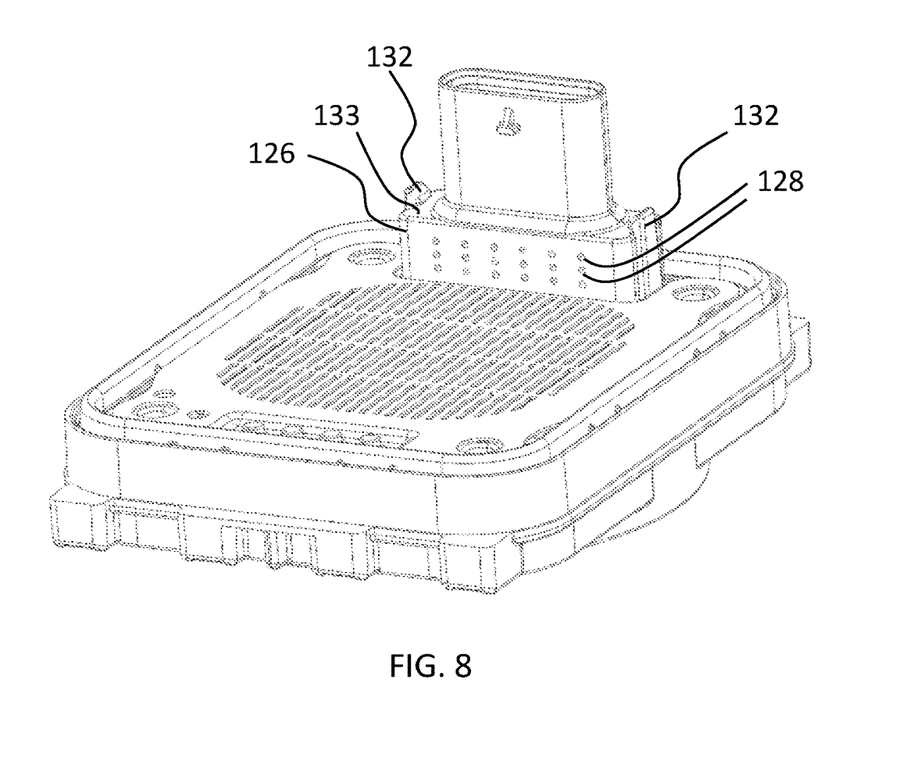
FIG. 8 shows a perspective view of the degassing unit 100 with the sensor module 120 inserted into the cavity 130.
Figure 9:
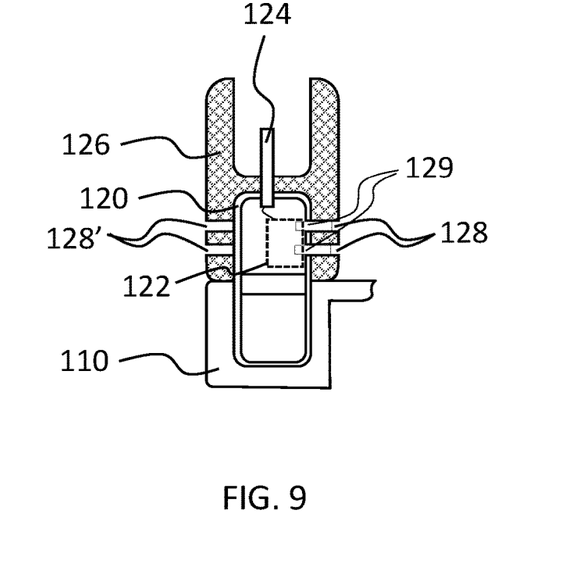
FIG. 9 shows a cross sectional view of the sensor module 120 inserted into the cavity 130 formed by the base 110.

FIG. 9 shows a cross sectional view of the sensor module 120 inserted into the cavity 130 formed by the base 110, for illustration. In FIG. 9, the sleeve 126 contacts the base 110 and covers the electronic housing 120. According to various embodiments, the sensor module 120 may include openings 128 for allowing gas exchange for sensing, for example a sensor housing may include openings, or a sensor PCB may be free of coating where necessary. The openings 128 may be arranged at a portion of the sensor module 120 that is unobstructed, for example, unobstructed by the cavity walls or fasteners. The openings may be at least partially overlapping openings 129 of the sensor module 120, so that gas can reach the sensor The openings 128 may face towards a central axis of the degassing unit 100 as shown in FIG. 8 and FIG. 9. The openings 128 may include opposing openings 128' on an opposite side of the housing, e.g., facing away from a central axis of the degassing unit 100. In some embodiments (not shown in FIG. 9) the sensor module 120 may include further openings that correspond to the opposing openings 128' thereby enabling further gas exchange. In other embodiments, as shown in FIG. 9 by way of example, the openings 128' are added to the sleeve 126 for reasons of symmetry, thereby the sleeve does not require a specific orientation when being attached to the electronic housing 120.

According to various embodiments, the sensor module 120 overlaps the semipermeable membrane 112 and covers less than half, preferably between ¹⁄₁₀₀th and one tenth, of a gas passage area of the gas passage 114.

According to various embodiments, the sensor module 120 may further include a locking mechanism 132 for restricting movement of the sensor module 120 in an insertion direction which may be a direction in which the sensor module 120 may be insertable into the cavity 130. According to various embodiments the locking mechanism 132 may be at least one snap lock element optionally two for interlocking with the sensor module 120. An example of such locking mechanism can be seen in FIG. 8.

According to various embodiments the at least one snap lock element may include a beam and a hook, and the sensor module 120 may include an edge that cooperates with the hook when the sensor module 120 may be engaged in the cavity 130.

According to some embodiments, the sensor module 120 may include a recess for receiving the beam.

According to various embodiments, a main frame of the base 110, a wall defining the cavity 130, and the snap lock element may be a monolithically injection molded part.

According to some embodiments the grid 115 may include an angled and/or bent portion which extends into the inner volume 202, wherein the angled portion may include attachment means adapted to cooperably engage with the sensor module 120 of the gas property sensor 122. In that case the base may be free of a cavity for the sensor module.

Figure 10:
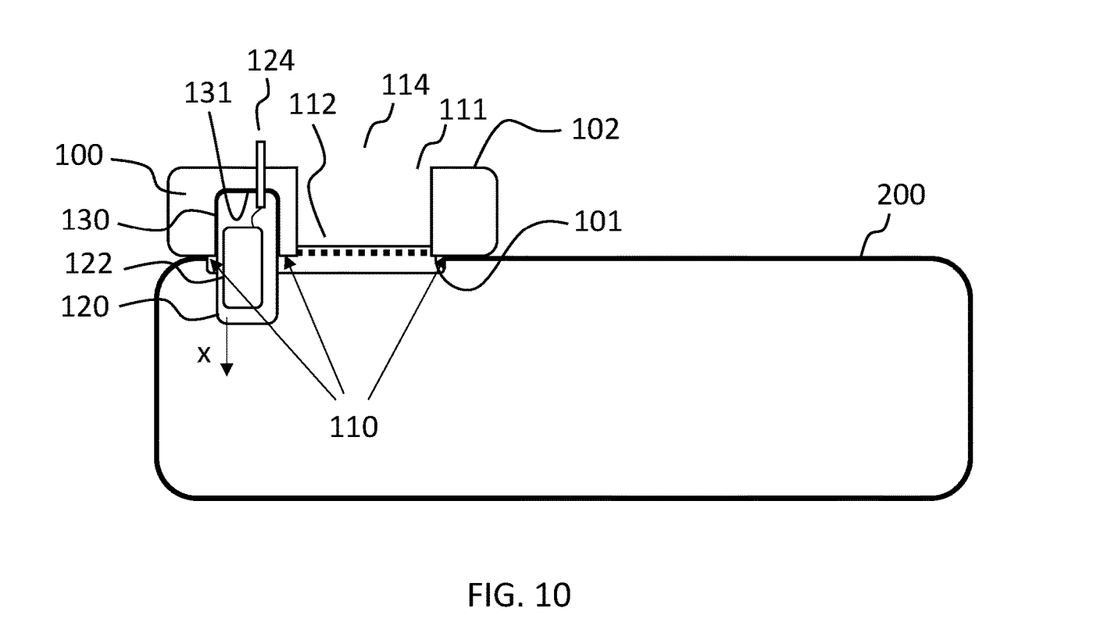
FIG. 10 which shows a cross sectional view of an alert system 10 similar to FIG. 4 with the addition of an electrical connector 124 which is configured to connect the gas property sensor 122 to an outer side 102.

While in some embodiments, the electrical connector 124 extends from the sensor module 120 towards the inner side 101, e.g., for connecting to a BMS1 of the electronic housing 200, alternatively or in addition, the electrical connector 124 may extend to the outer side 102, e.g., for connecting to electronic systems outside of the electronic housing 200. According to some embodiments, electrical connector 124 may pass through the wall of the cavity, for example, at the end 131 of the cavity 130, to the other side 102. Such through connections may be fluid tight thereby the electrical connector 124 may be blocked from gases from the battery 220 by the sensor module 120 and thereby protected from exposure to gases. FIG. 10 is similar to FIG. 4 with the addition of an electrical connector 124 which is configured to connect the gas property sensor 122 to an outer side 102.

Various embodiments relate to an electronic housing 200 including the battery system 200, a battery management system BMS1, and the degassing unit 100, wherein the gas property sensor 122 may be communication coupled to the battery management system BMS1.

Various embodiments relate to the electronic housing may be a main battery of an electrical or hybrid vehicle.

The invention claimed is:

1. An alert system for an electronic housing, comprising:
a gas property sensor and a processor,
wherein the gas property sensor and the processor are communication couplable to each other via a communication channel,
wherein the processor is configured to receive gas property data from the gas property sensor, and further configured to, based on the gas property data, determine a property of a battery comprised in the electronic housing,
a degassing unit for attaching to the electronic housing and configured to enable passage of gases and to prevent passage of liquids and solids,
wherein the gas property sensor is attached to the degassing unit at an inner side which is a side for facing an interior of the electronic housing.

2. The alert system of claim 1, wherein the processor is comprised by a battery management system and wherein the communication channel comprises a first wired communication channel and a second wireless communication channel.

3. The alert system of claim 1, wherein one of the first and second wireless communication channels is a main channel and the other one is a backup channel, and wherein the processor is configured to received data via the main channel and, when the main channel is faulty, receive data via the backup channel.

4. The alert system of claim 1, wherein the processor is configured to determine whether the communication channel is faulty, and issue an alert when determined that said communication channel is faulty.

5. The alert system of claim 1, wherein the property of the battery is a probability of a future thermal runaway within a pre-determined period of time.

6. A degassing unit for an electronic housing, the degassing unit comprising:
a base comprising an attachment means for fluid-tightly attaching the base to a venting opening of the electronic housing and an opening covered by a semipermeable membrane thereby forming a gas passage, the side of the base facing the venting opening being an inner side and the opposite side being an outer side facing the environment when in attached configuration,
wherein the semipermeable membrane enables passage of gases and prevents passage of liquids and solids therethrough,
wherein the semipermeable membrane is flat, when there is no gas pressure difference between opposing sides of the membrane,
a sensor module comprising a gas property sensor, the sensor module attachable to the base on an inner side of the base,
wherein the sensor module is configured to, when attached to the base, extends towards a first direction away from the semipermeable membrane.

7. The degassing unit of claim 6, wherein the base comprises a cavity adapted to cooperably engage with the sensor module.

8. The degassing unit of claim 7, wherein the sensor module is configured to conformally fit into the cavity.

9. The degassing unit of claim 7, wherein the cavity opening is on the inner side.

10. The degassing unit of claim 7, further comprising a connector on a side of the sensor module which is outside the cavity for connection with an electronic housing's inner.

11. The degassing unit of claim 10, wherein the connector comprises a sleeve which fits over the external portion of the sensor module and extends on at least on 2 opposite sides of the sensor module.

12. The degassing unit of claim 7, wherein the cavity extends towards the outer side and connectors are blocked from gases from the battery by the sensor module.

13. The degassing unit of claim 7, wherein the cavity and the sensor module are configured such that the sensor module protrudes towards the inner volume.

14. The degassing unit of claim 7, wherein the sensor module comprises openings for allowing gas exchange for sensing and faces towards a central axis of the degassing unit.

15. The degassing unit of claim 7, wherein the sensor module overlaps the semipermeable membrane and covers less than half, preferably between $1/100^{th}$ and one tenth, of a gas passage area of the gas passage.

16. The degassing unit of claim 7, wherein the sensor module further comprises a locking mechanism for restricting movement of the sensor module in an insertion direction which is a direction in which the sensor module is insertable into the cavity.

17. The degassing unit of claim 7, wherein the locking mechanism is at least one snap lock element for interlocking with the sensor module.

18. The degassing unit of claim 17, wherein a main frame of the base, a wall defining the cavity, and the snap lock element are a monolithic injection molded part.

19. An electronic housing comprising the battery system, a battery management system, and the degassing unit of claim 7, wherein the gas property sensor is communication coupled to the battery management system.

20. The degassing unit of claim 6, further comprising a grid at the inner side, wherein the grid comprises an angled portion which extends into the inner volume, wherein the angled portion comprises attachment means adapted to cooperably engage with the sensor module of the gas property sensor.

* * * * *